(12) United States Patent
Chang

(10) Patent No.: US 6,769,928 B2
(45) Date of Patent: Aug. 3, 2004

(54) STIR DEVICE FOR A BASE ON AN INTEGRATED CIRCUIT CHIP

(75) Inventor: Che-Chia Chang, Taipei (TW)

(73) Assignee: Comax Technology Inc., Taipei (TW)

( * ) Notice: Subject to any disclaimer, the term of this patent is extended or adjusted under 35 U.S.C. 154(b) by 0 days.

(21) Appl. No.: 10/176,086

(22) Filed: Jun. 21, 2002

(65) Prior Publication Data

US 2003/0124898 A1 Jul. 3, 2003

(30) Foreign Application Priority Data

Dec. 31, 2001 (TW) .................................... 90223982 U

(51) Int. Cl.[7] ................................................ H01R 4/50
(52) U.S. Cl. ........................................ 439/342; 439/70
(58) Field of Search ................................ 439/342, 266, 439/70

(56) References Cited

U.S. PATENT DOCUMENTS

| 5,569,045 | A | * | 10/1996 | Hsu ............................. 439/342 |
| 5,688,140 | A | * | 11/1997 | McHugh et al. ............. 439/342 |
| 5,722,848 | A | * | 3/1998 | Lai et al. ...................... 439/342 |
| 6,371,785 | B1 | * | 4/2002 | Howell et al. ............... 439/342 |

* cited by examiner

*Primary Examiner*—Michael C. Zarroli
(74) *Attorney, Agent, or Firm*—Troxell Law Office PLLC

(57) ABSTRACT

A stir device for a base on an integrated circuit chip is arranged in the base between a receiving space on an upper cover thereof and a receiving space on a lower seat thereof and the stir device includes a push lever and an actuation rod. The actuation rod has at least one tooth part and the receiving space of the upper cover has a meshing recess to accommodate the tooth part. Therefore, once the push lever of the stir device is turned, the upper cover can displace horizontally such that connecting pins on an integrated circuit chip, which is inserted into the upper cover can firmly contact with the contacts inserted into the lower seat.

2 Claims, 6 Drawing Sheets

STIR DEVICE FOR A BASE ON AN INTEGRATED CIRCUIT CHIP

BACKGROUND OF THE INVENTION

1. Field of the Invention

The present invention relates to a stir device for a base of an integrated circuit chip, and particularly to a stir device, in which at least a tooth part on an actuation rod thereof to accommodate a meshing recess disposed at a receiving space on an upper cover of the base such that a type of gear driving can be formed to allow the upper cover displacing horizontally with connecting pins on the integrated circuit chip, which is inserted into the upper cover, being able to contact with the contacts inserted into the lower seat firmly.

2. Description of Related Art

Currently, the displacement way of an upper cover of the base on an integrated circuit chip usually applies the principle of a cam. Referring to FIG. 1, a stir device for moving the upper cover provides a push lever and an actuation rod, which are disposed with different axial lines. As soon as the push lever is turned, the actuation rod can actuate the upper cover to displace horizontally and connecting pins of an integrated circuit chip inserted into the upper cover can contact with contacts inserted into the lower seat.

However, the push lever does not join with the actuation rod so that the upper cover and the lower seat have to be made for accommodating the push lever and the actuation rod. Thus, it is tedious to design a proper mold tool for fabricating the upper cover and the lower seat so that the design cost and the production cost for the mold tool are high and it is hard for the mold tool to accommodate the structure configuration of the upper cover and the lower seat. If the dimensions of the independent actuation rod and the receiving space of the upper cover are designed incorrectly, it will result in either the upper cover is in a state of moving upward during being actuated to displace horizontally or connecting pins on the integrated circuit chip inserted into the upper cover is unable to contact with the contacts inserted into the lower seat firmly because of incorrect displacement distance of the upper cover.

SUMMARY OF THE INVENTION

Accordingly, an object of the present invention is to provide a stir device for a base on an integrated circuit chip, with which a type of gear drive is involved to allow an upper cover of the base displacing horizontally, so that connecting pins on the integrated circuit chip, which is inserted into, the upper cover, can firmly contact with the contacts inserted into the lower seat.

For reaching the preceding object, the stir device for a base on an integrated circuit chip includes a push lever and an actuation rod. The actuation rod has one or more tooth parts and the receiving space of the upper cover has a meshing recess to accommodate the one or more tooth parts. Therefore, once the push lever of the stir device is turned, the upper cover can displace horizontally such that connecting pins on an integrated circuit chip, which is inserted into the upper cover, can firmly contact with the contacts inserted into the lower seat.

BRIEF DESCRIPTION OF THE DRAWINGS

The present invention can be more fully understood by reference to the following description and accompanying drawings, in which:

FIG. 3-1 is a perspective view illustrating the stir device shown in FIG. 2 being used for a base on an integrated circuit;

FIG. 3-2 is a perspective view similar to FIG. 3-1 with a projection angle different from FIG. 1;

FIG. 4-1 is sectional view illustrating the stir device of the present invention in a state of being operated; and FIG. 4-2 is a sectional view illustrating the stir device in another state of being operated.

DETAILED DESCRIPTION OF THE PREFERRED EMBODIMENTS

Figure 1:
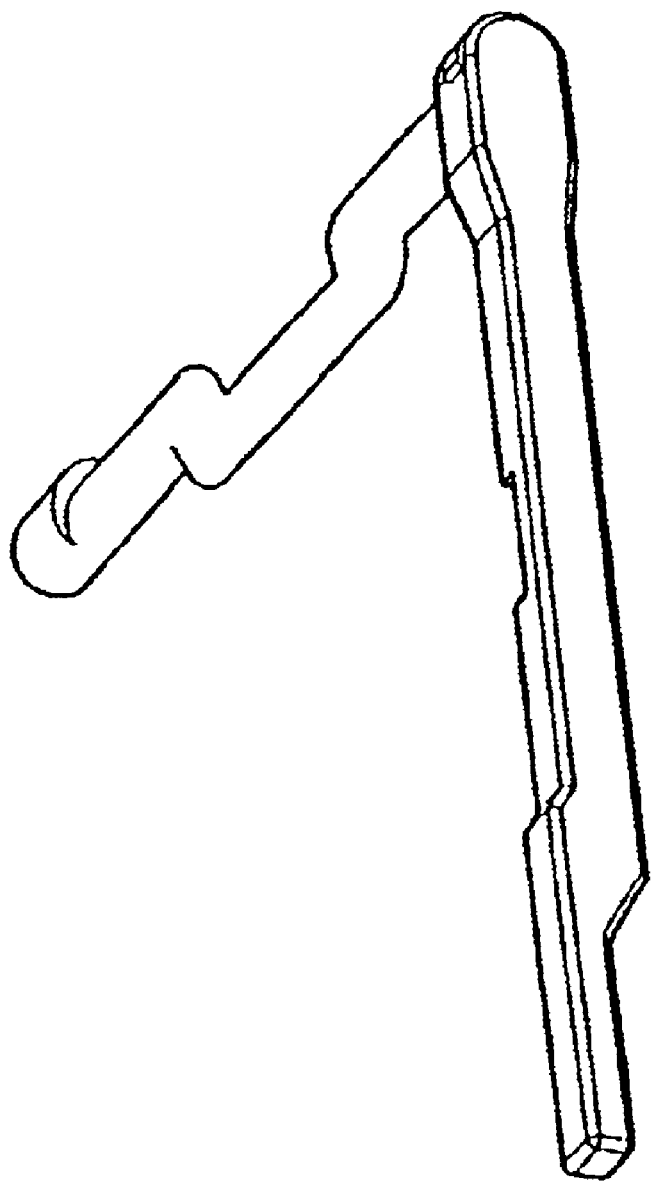
FIG. 1 is a perspective view of a conventional stir device for a base on an integrated circuit.
Figure 2:
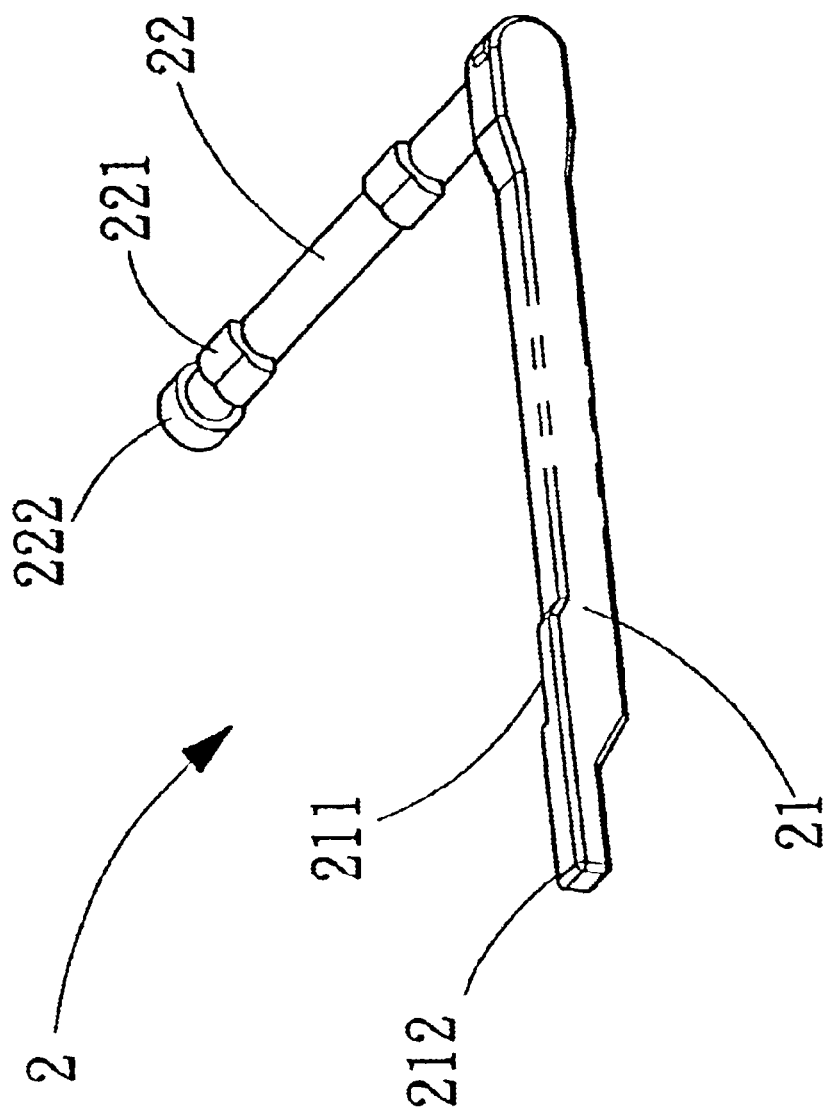
FIG. 2 is a perspective view of a stir device for a base on an integrated circuit according to the present invention.
Figures 1, 3:
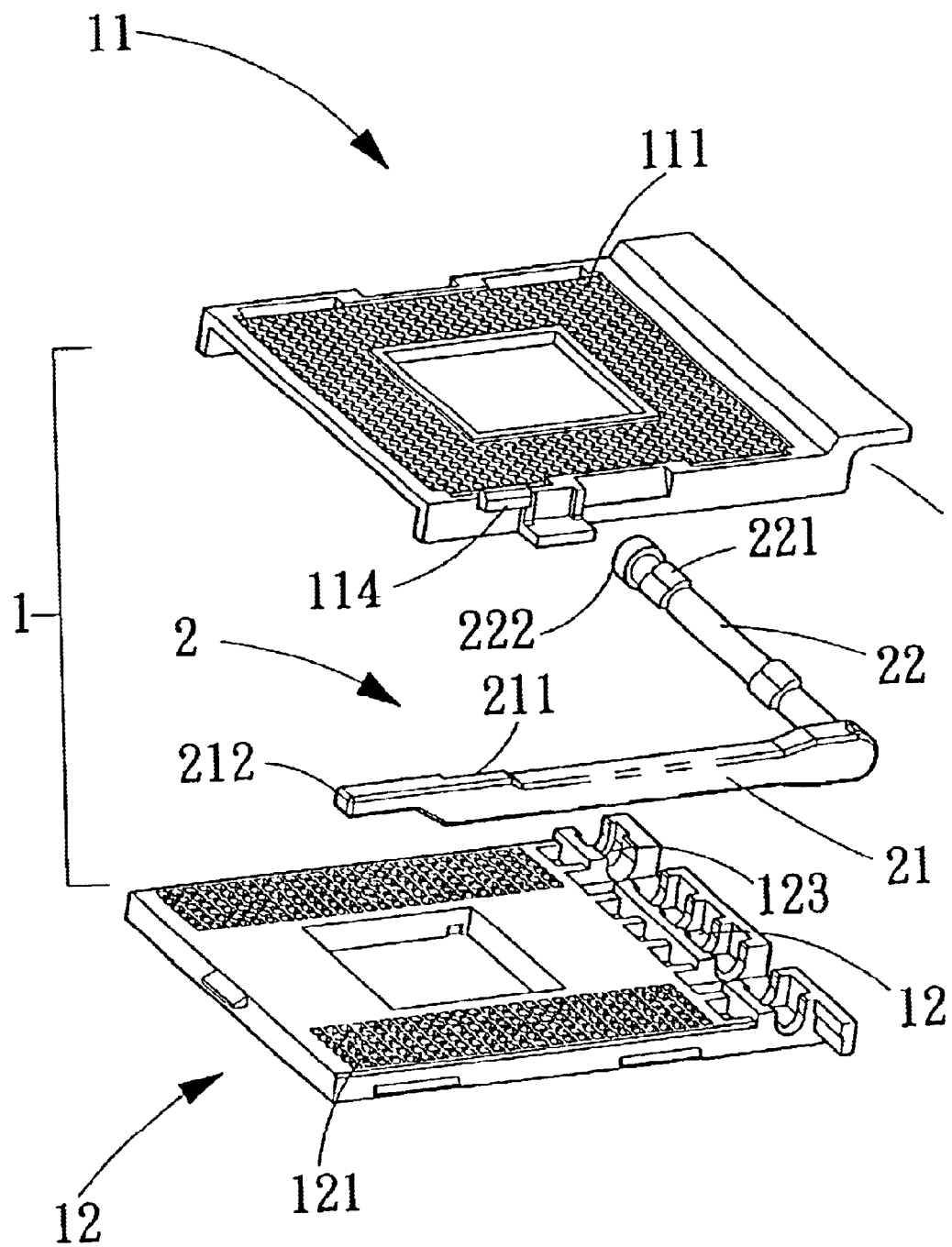
Figures 2, 3:
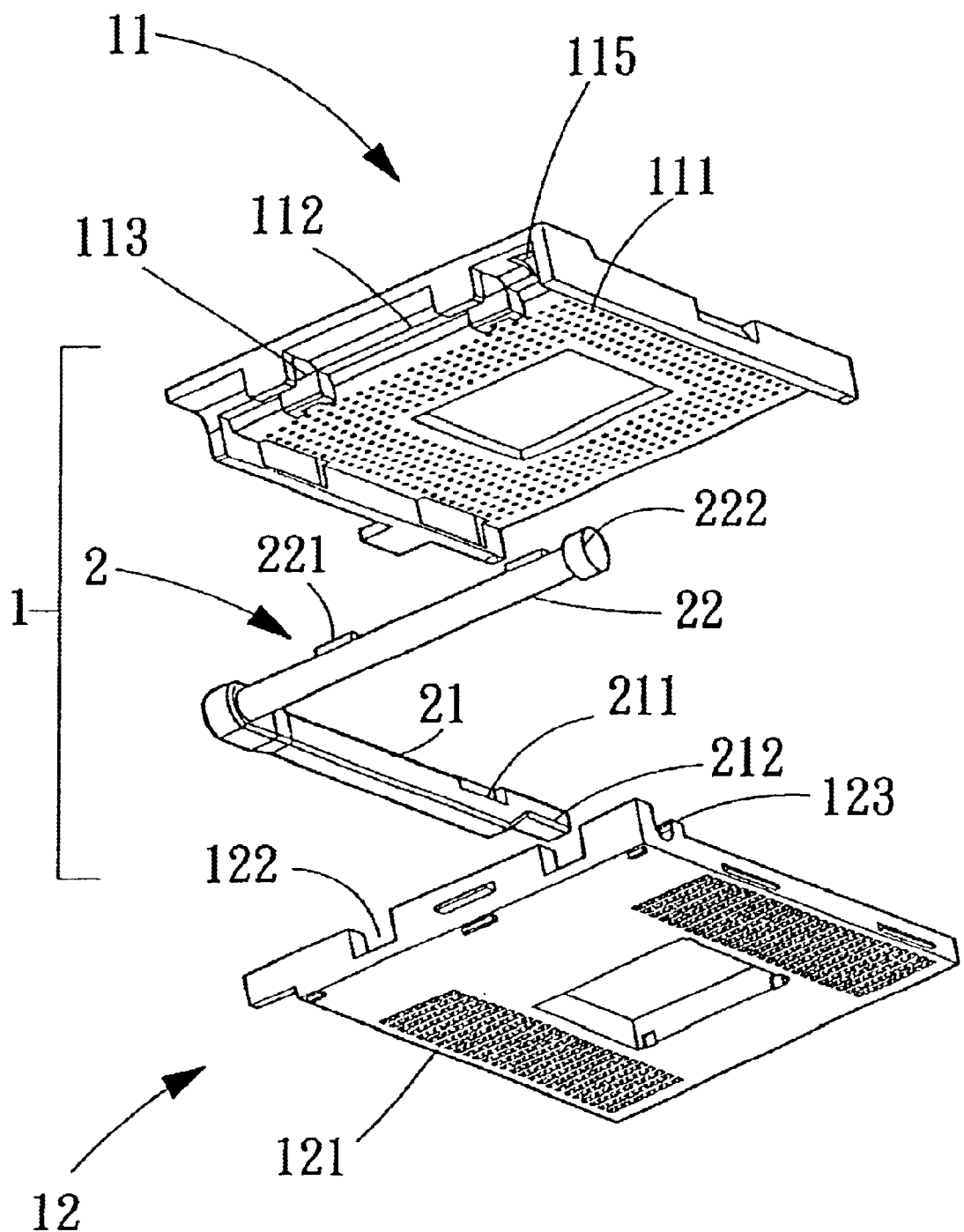

Referring to FIGS. 2, 3-1 and 3-2, a stir device of the invention is illustrated and the stir device 2 is disposed in receiving spaces 112, 122 on the upper cover 11 and the lower seat 12 respectively. The stir device 2 has a push lever 21 and an actuation rod 22.

Wherein, the actuation rod 22 on the stir device 2 is provided with at least one tooth part 221 and the receiving space 112 at the inner side of the upper cover 11 has a meshing recess 113 to receive the tooth part 221. Thus, as soon as the push lever 21 of the stir device 2 is turned, the tooth part 221 on the actuation rod 22 can actuate the upper cover 11 to displace horizontally.

Besides, an anti-slip part 222 is arranged to a proper position on the actuation rod 22 and anti-slip recess parts 115, 13 are provided on the receiving spaces 11, 12 respectively corresponding to the anti-slip part 22 such that the it can prevent the stir device 2 from horizontally displacing away the base 1.

Further, the upper cover 11 at a lateral side thereof next to the push lever extends a stopper 114 and the push lever 21 has a locating recess 211 corresponding to the stopper 114. In order to facilitate the push lever 21 being turned, the push lever 21 at an end thereof is provided with a trigger head 212.

Figures 1, 4:
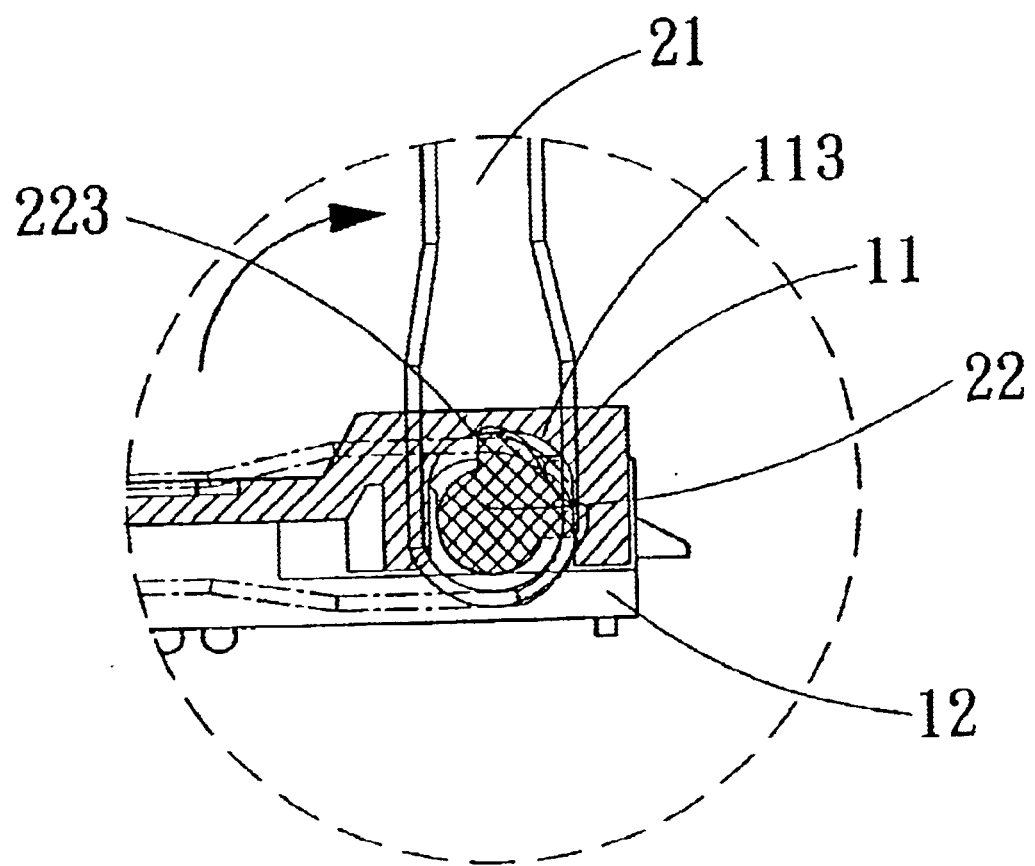
Figures 2, 4:
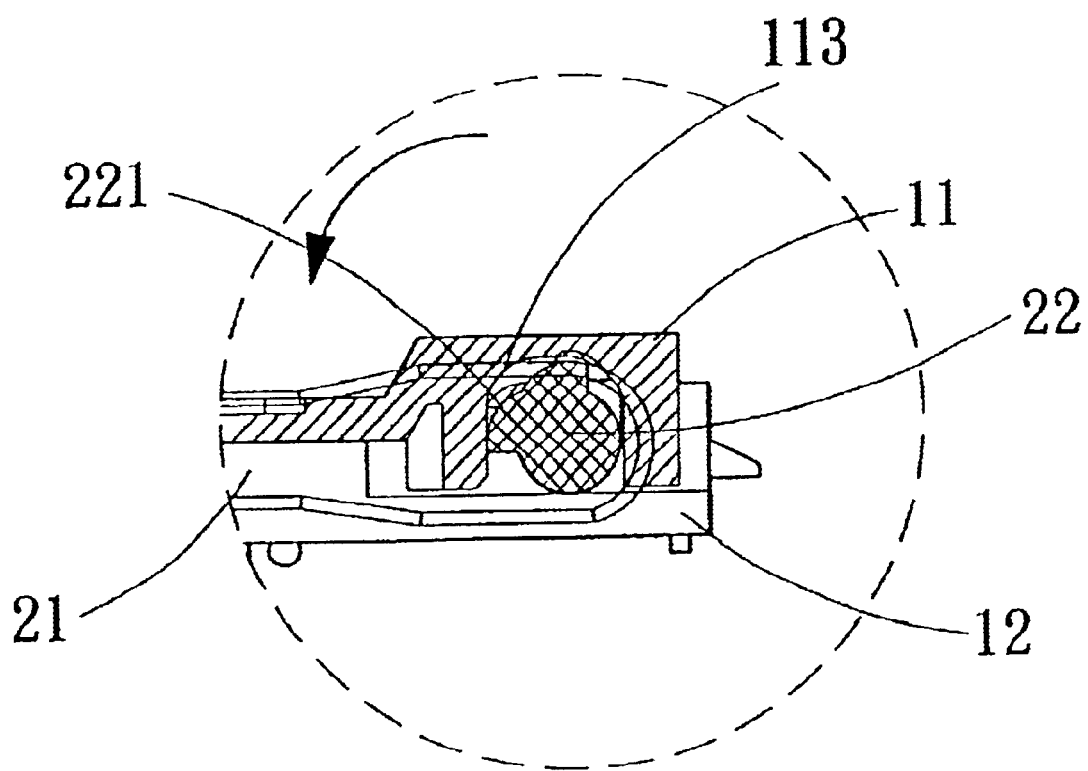

Thus, the tooth part 221 in the meshing recess 113 can actuate the upper cover 11 to displace horizontally as soon as the push lever 21 of the stir device 2 is turned as shown in FIGS. 4-1 and 4-2. In this way, the connecting pins 11 on an integrated circuit chip, which is inserted into the upper cover 11, can contact with the contacts 121 inserted into the lower seat 12 firmly.

It is appreciated from the preceding description that a stir device for a base on an integrated circuit chip according to the present invention has teeth on an actuation rod to accommodate a meshing recess disposed at a receiving space on the upper cover of the base such that a type of gear driving can be formed to allow the upper cover displacing horizontally. In this way, in this way, the connecting pins on an integrated circuit chip, which is inserted into the upper cover, can contact with the contacts inserted into the lower seat firmly.

While the invention has been described with reference to the a preferred embodiment thereof, it is to be understood that modifications or variations may be easily made without departing from the spirit of this invention, which is defined by the appended claims.

What is claimed is:

1. A stir device for a base with an integrated circuit chip positioned in the base between a first receiving space in an upper cover and a second receiving space in a lower seat, the stir device comprising:

a) an anti-slip recess formed in the upper cover and the lower seat;

b) a meshing recess in the first receiving space;

c) a push lever; and d) an actuation rod connected perpendicularly at a first end thereof to the push lever, the actuation rod having one anti-slip part formed on a second end and engaging the anti-slip recess and two spaced apart teeth formed between the push lever and the anti-slip part, each of the two teeth including two arcuate segment outer surfaces located outwardly of a surface of the actuation rod inserted into the meshing recess in the first receiving space in the upper cover, wherein the arcuate segment outer surfaces press against the meshing recess when the push lever is turned to move the upper cover horizontally such that connecting pins on the integrated circuit chip in the upper cover contact contacts in the lower seat.

2. The stir device according to claim 1, further comprising a stopper on a lateral side of the upper cover and a locating recess on the push lever that engages the stopper.

* * * * *